(12) United States Patent
Ives et al.

(10) Patent No.: US 9,698,454 B1
(45) Date of Patent: Jul. 4, 2017

(54) HIGH POWER RF WINDOW DEPOSITION APPARATUS, METHOD, AND DEVICE

(71) Applicants: R. Lawrence Ives, San Mateo, CA (US); Gerald Lucovsky, Cary, NC (US); Daniel Zeller, Scottsdale, CA (US)

(72) Inventors: R. Lawrence Ives, San Mateo, CA (US); Gerald Lucovsky, Cary, NC (US); Daniel Zeller, Scottsdale, CA (US)

(73) Assignee: Calabazas Creek Research, Inc., San Mateo, CA (US)

( * ) Notice: Subject to any disclaimer, the term of this patent is extended or adjusted under 35 U.S.C. 154(b) by 0 days.

(21) Appl. No.: 13/937,216

(22) Filed: Jul. 9, 2013

(51) Int. Cl.
*H05H 1/24* (2006.01)
*H01P 1/08* (2006.01)

(52) U.S. Cl.
CPC ..................... *H01P 1/08* (2013.01)

(58) Field of Classification Search
CPC .......................................... H01P 1/08
USPC ................................ 427/569–579
See application file for complete search history.

(56) References Cited

U.S. PATENT DOCUMENTS

| 5,246,881 | A * | 9/1993 | Sandhu et al. ................ 438/681 |
| 5,397,428 | A * | 3/1995 | Stoner et al. ................... 117/86 |
| 7,012,386 | B1 * | 3/2006 | Berg et al. ..................... 315/505 |
| 2010/0003406 | A1 * | 1/2010 | Lam et al. ............. 427/255.391 |
| 2010/0183857 | A1 * | 7/2010 | Nouvelot et al. ............. 428/213 |
| 2011/0151678 | A1 * | 6/2011 | Ashtiani et al. .............. 438/786 |

\* cited by examiner

*Primary Examiner* — Michael Wieczorek
*Assistant Examiner* — Michael G Miller
(74) *Attorney, Agent, or Firm* — File-EE-Patents.com; Jay A. Chesavage

(57) ABSTRACT

A process for forming a coating for an RF window which has improved secondary electron emission and reduced multipactor for high power RF waveguides is formed from a substrate with low loss tangent and desirable mechanical characteristics. The substrate has an RPAO deposition layer applied which oxygenates the surface of the substrate to remove carbon impurities, thereafter has an RPAN deposition layer applied to nitrogen activate the surface of the substrate, after which a TiN deposition layer is applied using Titanium tert-butoxide. The TiN deposition layer is capped with a final RPAN deposition layer of nitridation to reduce the bound oxygen in the TiN deposition layer. The resulting RF window has greatly improved titanium layer adhesion, reduced multipactor, and is able to withstand greater RF power levels than provided by the prior art.

20 Claims, 6 Drawing Sheets

Figure 2A

202 Cleaning
1) 2 min methanol rinse
2) 30 sec 10% HF soak
3) DI water soak
4) Nitrogen Dry

204 Substrate Heating
1) flow 200 sccm He @ 300mtorr
2) heat substrate to 300C

206 RPAO Deposition
Flow 200 sccm He + 20 sccm $O_2$ as plasma @ 300mtorr for 60s. Plasma density is 30W @ 13.6Mhz, frequency tuned for minimum reflected power

208 RPAN Deposition
Flow 200 sccm He + 60 sccm $N_2$ as plasma @ 300mtorr through chamber for 30s. Plasma density is 30W @ 13.6Mhz, frequency tuned for minimum reflected power

210 TiN Deposition
1) Flow 200 sccm He + 60 sccm $N_2$ as plasma excited gas through chamber.
2) Introduce Titanium t-butoxide with He carrier gas @ 20sccm.

Figure 2B
| | 212 | (Titanium t-butoxide turned off), Flow 200 sccm He + 60 sccm N₂ as plasma excited gas through chamber. |
|---|---|---|
| RPAN Cap | | |
| | 214 | 1) Flow 200 sccm He at 300mtorr, cool to below 100C. |
|---|---|---|
| Sample Cooling | | |
Figure 3
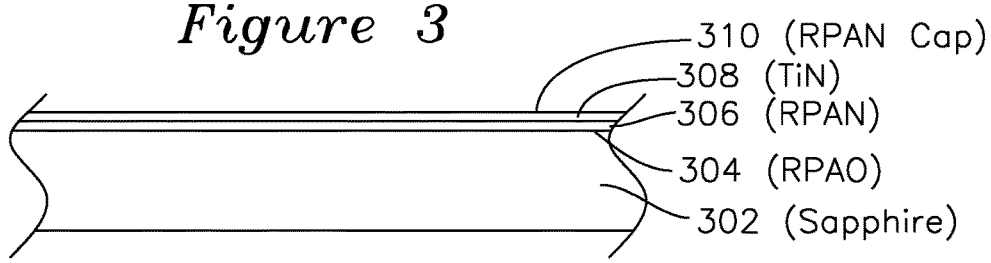
- 310 (RPAN Cap)
- 308 (TiN)
- 306 (RPAN)
- 304 (RPAO)
- 302 (Sapphire)
Figure 4A
Ti tert (t-) butoxide
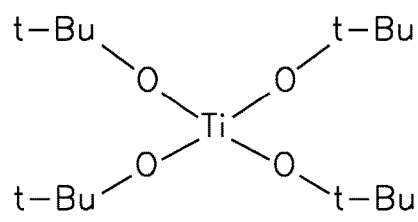
Figure 4B
dimethylamino titanium
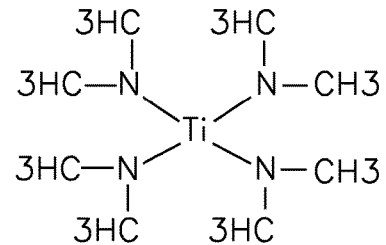

Rectangular waveguide with Pillbox Window

VSWR vs Frequency for Fig 7

Circular Waveguide with Iris

VSWR vs Frequency for Fig 9

HIGH POWER RF WINDOW DEPOSITION APPARATUS, METHOD, AND DEVICE

The present invention was developed under Department of Energy grant #DE-SC0004571. The government has certain rights in this invention.

FIELD OF THE INVENTION

The present invention relates to a coating for an RF window. In particular, the invention relates to a coating for an RF dielectric window for waveguide use at high RF power levels.

BACKGROUND OF THE INVENTION

High energy accelerators typically operate with high vacuum, as do the RF sources that deliver the drive power to the accelerator cavities. Consequently, RF windows are required to maintain vacuum integrity during installation and removal of sources from the accelerator. RF windows are also required on the RF source to maintain internal vacuum. Typically, the RF power is transmitted in rectangular, circular or coaxial waveguide, so the RF windows between waveguide sections are required to function in the appropriate geometry. Most RF windows are fabricated from high purity alumina ceramic, and at high RF levels, the electric fields around discontinuities in the waveguide or on the surface of the RF window become high enough to cause multipactor, which is a resonant discharge caused by an avalanche of secondary electrons driven by the RF fields. The susceptibility for multipactor is a function of the RF power level, pulse width, RF frequency, secondary electron yield, DC charge on the RF window, and the surrounding gas environment. When multipactor occurs, energy is transferred from the RF wave to the cascading electrons, which energy is then deposited into the surface of the RF window. Failure of the RF window occurs when the thermo mechanical stresses which accumulate on the ceramic RF window exceed the yield strength of the RF window material. Often, this failure is catastrophic, resulting in breakage of the RF window and complete loss of vacuum integrity. One technique to address multipactor discharge is to sputter a 10-20 Angstrom thickness layer of a conductive coating on the surface of the RF window. Sputter deposition coatings utilize a physical deposition process where an evaporated metal condenses onto a surface as a film. Among the many problems of such film depositions are the poor adhesion between the substrate and the film, which relies on mechanical bonding at the surface of the substrate.

Accordingly, three important factors impact the window design. First, the window must support the high RF electric field without breakdown. Second, the window must be protected from multipactor to avoid surface damage and ultimately failure. Third, the RF window material must survive the thermal and mechanical stresses encountered during operation and exposure to atmospheric pressure. In configurations where the waveguide is pressurized with a dielectric gas, such as $SF_6$, the window must adequately support the resultant differential pressure. Finite element analysis codes provide highly accurate simulation of the thermo mechanical stresses imposed on the RF window. A high reliability RF window should have adequate safety margins against failure for static pressures due to differential pressure and the thermal loads imposed when transmitting RF power. Thermal stresses depend on the amount of RF power absorbed during the RF transmission, which depends on the loss tangent of the material, and the thermal stresses which develop also depend on how the RF window is cooled. The ability to adequately manage the resultant thermal stresses depends on the yield strength of the material. The magnitude of the RF electric fields can be calculated analytically or simulated with time domain RF codes, such as the High Frequency Structure Simulator (HFSS) by Ansys (Canonsburg, Pa.). The susceptibility to arcing at the RF window depends on the geometry and the mode of the RF transmission. Most RF power is transmitted in fundamental mode through a waveguide. For a rectangular waveguide this is the TE10 mode, for circular waveguide this is the TE0n modes, and for a coaxial waveguide it is the TEM mode. Both TE and TEM modes impose electric fields parallel to the window surface and TEM modes impose electric fields perpendicular to the waveguide walls. Common failure mechanisms for an RF window positioned in the waveguide propagation path are electrical breakdown initiated at the waveguide-RF window joint, or surface flashover on the window surface. Arcing initiated at the waveguide-RF window joint is most prevalent, since this joint presents an interface involving four materials: the RF window, metallization of the RF window, a braze alloy, and the surrounding waveguide material. Any exposed edges or protrusions increase the local field gradient, generating an enhanced electric field which initiates the arcing which leads to breakdown. An alternative is to use an overmoded window with an axi-symmetric mode.

It is desired to provide an RF window which is resistant to multipactor, has a long usable life, and is suitable for use in a waveguide carrying RF power levels on the order of 100 MW and above.

OBJECTS OF THE INVENTION

A first object of the invention is a chamber for titanium nitride film deposition onto a substrate, the chamber having a plasma source for generating plasma gasses containing mixtures of at least helium, nitrogen, and oxygen, the plasma gasses conveyed through a flow rate valve for each gas and into a plasma chamber with subsequently excites the gasses into a plasma and couples the plasma into the chamber, the chamber having a substrate support which receives the plasma gasses, the substrate support also receiving an organo-metallic titanium source in gaseous form, including at least one of titanium tert-butoxide (Ti t-butoxide) gas or titanium dimethylamino (TDMAT) gas, which is mixed with the plasma gasses, the resultant gas mixture impinging onto the RF window substrate, with spent gas mixtures conveyed out of the chamber, the gas mixture held at a regulated pressure, and where the titanium tert-butoxide gas is generated by bubbling titanium tert-butoxide mixed with a carrier gas and introduced into the diffuser ring in the direction of flow preceding the substrate.

A second object of the invention is a deposition process for titanium film deposition onto a substrate suitable for use in an RF window, the deposition process having a cleaning step, a substrate heating step, a remote plasma assisted oxidation (RPAO) step where helium and oxygen gas are introduced as a plasma onto the surface of the substrate, after which nitrogen is substituted for the oxygen under the same conditions in a remote plasma assisted nitridation (RPAN) step, after which an organo-metallic titanium source in gaseous form, such as titanium t-butoxide or TDMAT is introduced with a carrier gas in a TiN deposition step, the mixture of which impinges onto the substrate, after which the titanium t-butoxide is removed from the mixture to form a nitrogen cap deposition layer in a remote plasma activation nitrogen (RPAN) step, after which the sample is cooled using helium gas.

A third object of the invention is an RF window which is formed by RPAO deposition followed by RPAN deposition, followed by TiN deposition, followed by RPAN deposition.

SUMMARY OF THE INVENTION

A chamber for deposition is coupled to sources of Helium, Nitrogen, and Oxygen gasses which are separately controllable for volume flow, the gasses mixed and formed into a plasma and introduced into the chamber, the plasma gasses passing through a diffuser ring which serves to introduce an organo-metallic gas such as titanium t-butoxide gas or tetrakis (dimethylamino) titanium (TDMAT) gas for mixing with the plasma gasses and impinging onto the surface of a RF window substrate, where the RF window substrate may be any RF window dielectric material to be coated, including, but not limited to, ceramics such as those formed by sintering, or non-sintered substrate materials such sapphire, quartz, or diamond. In a deposition process, the chamber performs deposition, in successive steps, as a heating step, an RPAO deposition step, an RPAN deposition step, a TiN deposition step, an RPAN cap step, and a cooling step. The heating step includes heating the substrate to a temperature of substantially 300° C. while introducing helium gas into the chamber at a flow rate of substantially 200 standard cubic centimeters (sccm) and at a pressure of substantially 300 mTorr. The RPAO deposition step includes flowing a mixture of 200 sccm of helium mixed with 20 sccm of $O_2$ delivered as a plasma and at a pressure of substantially 300 mTorr, which impinges onto the substrate surface for an RPAO deposition step duration of time. The RPAN deposition step includes flowing a mixture of 200 sccm Helium gas with 60 sccm of nitrogen gas formed into a plasma for an RPAN deposition step duration of time. The TiN deposition step includes flowing 200 sccm of Helium with 60 sccm of nitrogen under the same conditions as the preceding RPAN deposition step, but with Titanium tert-butoxide mixed with a helium carrier gas for a TiN deposition step duration of time. The RPAN cap step which follows the TiN deposition step uses substantially the same gas mixtures and pressures as the previous RPAN deposition step, but with the TiN source excluded. The final cooling step utilizes 200 sccm of Helium which is delivered until the substrate is cooled below 100° C.

The processing sequence is based on separate and independent control of the interface between the substrate and the TiN film, and the deposition of the remainder of the TiN film with remote plasma processing. In one embodiment of the invention, the chamber is coupled to another chamber which performs an in-line chemical characterization using Auger electron spectroscopy for atomic characterization of the deposition layers.

In another embodiment of the invention, an RF window comprises a substrate coated with an oxygenated RPAO deposition layer, followed by a nitridation RPAN deposition layer, followed by TiN deposition layer, followed by a nitridation RPAN cap layer.

BRIEF DESCRIPTION OF THE DRAWINGS

FIGS. 2A and 2B are flowcharts for a deposition process using the chamber of FIG. 1.

FIG. 3 is a cross section view of an RF window fabricated according to the process of the present invention.

FIGS. 4A and 4B show the chemical structure of Titanium tert-butoxide and dimethylamino titanium, respectively.

DETAILED DESCRIPTION OF THE INVENTION

Figure 1:
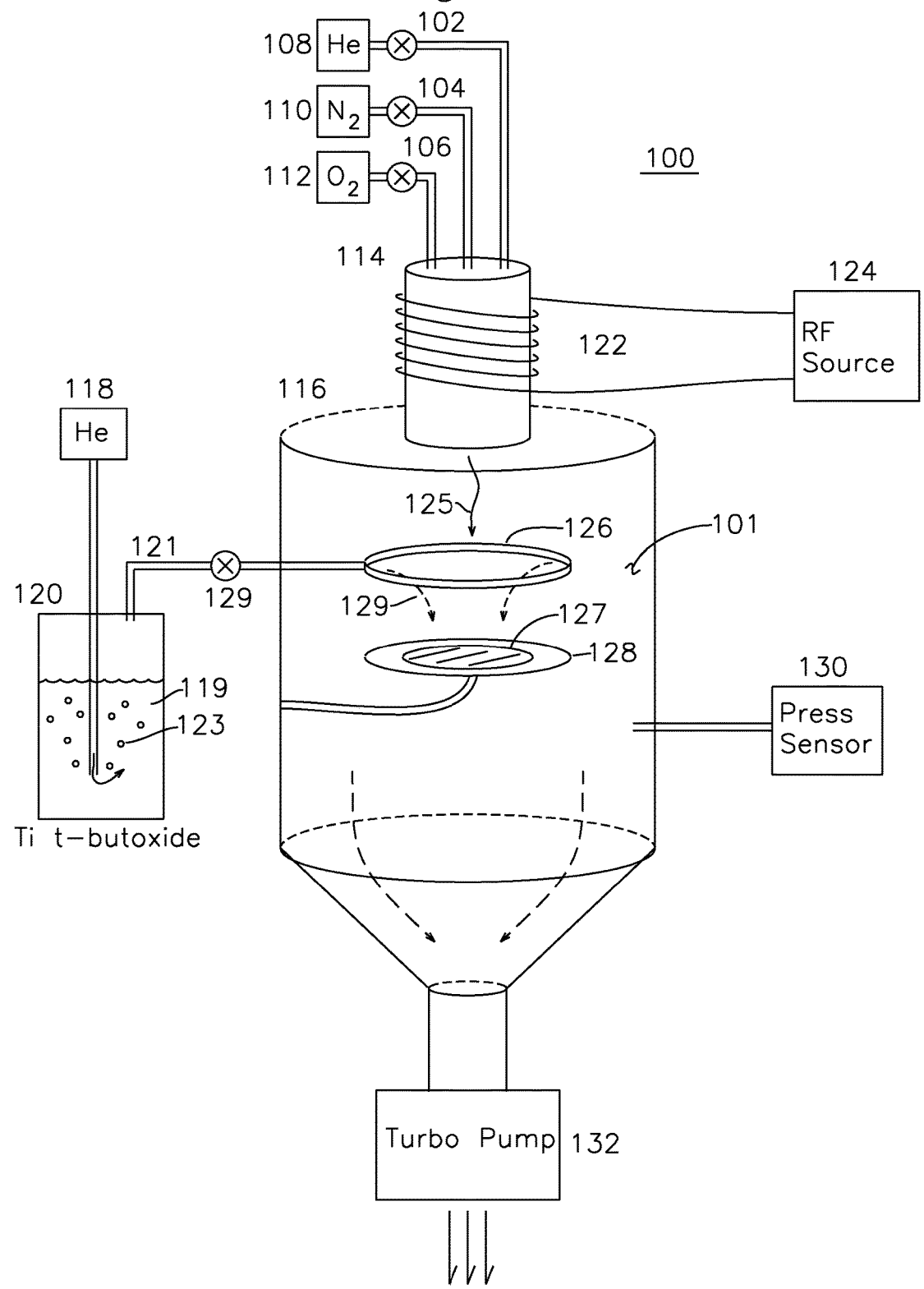
FIG. 1 is a perspective view of a chamber for chemically bonding titanium or titanium nitride onto a substrate.

The present invention describes the formation and application of titanium nitride as an RF window coating material, which has the advantages of reducing the secondary electron yield from multipactor, and also prevents the build up of excessive charge on the RF window surface. When applied as a sputtered film, the degradation of the film over time remains a problem, largely due to adhesion failures at the substrate interface layer. Failures of these sputtered windows may occur after months or years of operation, and there does not appear to be an obvious way of verifying the integrity of the coating until the window fails. The inventors have experimentally determined from Si nitride ($Si_3N_4$) that films which are applied using a sputtering process fail because of the high affinity of Si to combine with oxygen. A contributory issue is the base pressures used in sputtering systems are not in the ultra high vacuum (UHV) regime. Small partial pressures of $H_2O$ and CO are typically resident in the system.

The material purity, as well as the structure, plays an important role in high power windows. Factors which may also play a role in the failure include the surface film conductivity, the microwave/RF transmission, the durability of a sputtered film, and the absence of degradation of the film over time and usage. There are other undesirable processes that also can remove the surface film, including surface arcs which may occur during the high power processing of the RF window.

The present invention provides a coating process for eliminating single surface multipactor, and the coating process also is compatible with the thermo mechanical and electrical issues associated with high peak and average power transmission. Specifically, the coating process enhances chemical bonding of thin conductive layers of metallic materials to the RF window substrate at the atomic level, which increases the surface durability and accordingly increases the reliability of the applied conductive layers in high RF power environments. The present chemical bonding produces metal layers which are distinct from the prior art mechanical bonding of sputtered metals as films. The inventors have observed significantly improved bonding to the substrate in the present chemical bonding compared to the prior art of sputtered films.

In contrast with sputtered films, the present technique implants materials into the RF window substrate surface which modifies the surface chemistry of the substrate, eliminating the requirement for a surface film that could be damaged or removed during operation. The resulting RF window substrate, when used as a dielectric window in a waveguide, is capable of much higher average power transmission than is available using prior art techniques. The present invention thereby increases the power density capability of an RF window operating in a vacuum, reducing the cost for accelerator systems, and also allows development of higher power RF sources, resulting in additional cost savings.

FIG. 1 shows an example deposition system 100 according to the present invention. The operation of deposition system 100 is controllable to achieve specific deposition coatings in a particular sequence, however for the purposes of understanding the deposition system 100 itself, the details of the process will be described after the operation and functions of the deposition system have been described. Accordingly, the following description is directed only to the deposition apparatus 100 and its controllable elements.

Helium gas source 108, nitrogen gas source 110, and oxygen gas source 112 have flow rates which are controllable by valves 102, 104, and 106, respectively, and the flow rates controls are with respect to volume flows measured in standard cubic centimeters per minute (sccm), where a standard cubic centimeter per minute is a volume flow rate of the selected gas which has been normalized to be equivalent to a temperature of 0° C. and pressure of 1 atmosphere. The He, $N_2$, and $O_2$ gasses which are selected with flow valves 102, 104, 106, respectively, are passed through an RF plasma generator 122, which is excited by an RF source operating, for example, at 13.6 Mhz and providing 30 watts of power, or any frequency and power which creates a plasma from the introduced gasses. The RF source may be tuned for minimum reflected power such that, for example, 30 W of RF power is applied to a flow rate of 200 sccm of He combined with either 20 sccm of $O_2$ or 60 sccm of $N_2$, as will be described. The primary function of the plasma gas is to convey active species of O metastable molecular ions and N atoms (or radicals) to the substrate 127 deposition surface when those respective gasses are selected and conveyed during the associated processing steps which utilize those plasma gasses.

The plasma gas which forms from sources 108, 110, 112 passes as a plasma gas 125 into the chamber 101 through a diffuser ring 126, which, when enabled, is coupled to a sealed canister 120 at constant temperature, where the canister 120 receives a stream of Helium carrier gas 118. The Helium carrier gas 118 bubbles 119 through the Ti t-butoxide 119 at constant temperature, such as by immersion of canister 120 into a glycerin bath which serves to maintain the vapor pressure of the Ti t-butoxide. The constant temperature regulation of canister 120 maintains a constant vapor pressure of Ti t-butoxide, thereby avoiding variations in the density of Ti t-butoxide delivered to the chamber with the He carrier gas. The Ti t-butoxide and Helium carrier gas are collected by receiver 121, pass through flow control valve 129, optionally heated to match the temperature of the other gasses introduced into the chamber 101, and delivered to the diffuser ring 126, which mixes the titanium t-butoxide and Helium carrier gas with the earlier formed plasma gas 125, which collectively impinge onto the substrate 127 to be coated, which is supported by a heated support carrier 128. A pressure sensor 130 regulates the interior pressure of the chamber 101 using turbo pump 132 with throttle valve, which removes the spent gasses and maintains the operational chamber pressure of typically 200-300 mTorr. In this manner, the flow rates into the chamber are controlled by volume control valves 102, 104, 106, and 129, and the chamber pressure is controlled by turbo pump and throttle valve 132 using a chamber 101 pressure measured by sensor 130.

FIG. 2A shows one example set of process steps for a deposition coating for an RF window. In a cleaning step 202, a substrate to be prepared is cleaned using a methanol rinse, followed by a 30 second soak in 10% hydrofluoric acid, followed by a deionized water soak, followed by a nitrogen dry cycle, all of which typically occur in a separate cleaning chamber (not shown) which allows for transfer of the cleaned substrate 127 onto support 128 shown in FIG. 1. A heating cycle 204 follows, where helium gas 108 flows through volume flow valve 102 at a rate of 200 sccm and a pressure of 300 mTorr, while the substrate support 128 heats the RF window substrate 127 to 300° C. A typical heating cycle duration may last for one hour, although other durations may also be acceptable.

The heating step 204 is followed by a remote plasma assisted oxidation (RPAO) step 206, where 20 sccm of $O_2$ is added to the 200 sccm flow of Helium, and the Helium and Oxygen gasses are formed into a plasma using plasma generator 122 of FIG. 1, with the RPAO deposition step duration being substantially 60 seconds and with a deposition pressure of 200-300 mTorr. The RPAO step duration may be set to any experimentally or empirically established duration such as 30 seconds which results in a controlled substrate surface oxidation. The RPAO process step 206 activates the substrate surface with oxygen and removes residual carbon contamination, such as from residual hydrocarbons which remain from the solvent cleaning. The RPAO process 206 step thereby serves three functions: it provides an in-situ chemical clean that removes carbon contamination, usually hydrocarbons, from the substrate surface, for sapphire substrates, it forms an Al-oxide layer with a thickness of the order of 0.5 to 0.6 nm with an average AlOx, x<3/2, sub oxide composition, and the surface of this AlOx layer is chemically-activated and initially forms a template for subsequent RPAO and RPAN processing. The nitridation by the RPAN process provides a chemical bridge for the formation and adhesion of the TiN thin film at the atomic level. The plasma gasses used in the RPAO step may alternatively be any mixture of oxygen and helium, including in one embodiment a mixture of substantially 20% oxygen and 80% helium by volume and delivered as a mixture at 20 sccm to be then mixed with helium at 200 sccm before forming into a plasma for application to the substrate surface.

Remote Plasma Assisted Nitridation (RPAN) step 208 follows the RPAO step 206 and operates similarly, but substitutes $N_2$ at 60 sccm for the previous step 206 $O_2$ at 20 sccm, and with the plasma density, chamber pressure, and other process parameters preserved. The duration of the RPAN Deposition step is 60 seconds, or any duration which results in adequate surface nitrogen activation, as the RPAN process step improves the bonding between the activated sapphire substrate and the TiN film, which is applied in the subsequent step.

In the TiN deposition step 210, the 200 sccm He flow and 60 sccm $N_2$ flow as a mixture of plasma excited gasses continues, and titanium tert-butoxide (also referenced as Ti t-butoxide) is introduced with He carrier gas at 20 sccm with the He carrier gas bubbled through the Ti tert-butoxide held at a fixed temperature such as by holding the Ti tert-butoxide in a glycerin bath, forming a layer of TiN at the substrate surface for the duration of the TiN deposition step 210. The TiN coating thickness may be controlled by changing the TiN deposition step duration, or by changing chamber pressure. For example, A Ti coating thickness on the order of 5 nm may be accomplished using a 15 minute step 210, and a coating thickness of 3 nm may be accomplished using a TiN deposition step duration of 10 minutes. It is believed that the thinnest practical film would be on the order of three unit cells of thickness, or on the order of 1 nm. The TiN Coating thicknesses may also be decreased for a given step duration by reducing the chamber pressure to less than 300 mTorr. Various forms of reactable titanium in gaseous form may be delivered, including titanium tert-butoxide or dimethylamino titanium as will be described later.

The TiN deposition step 210 is followed by a remote plasma activated nitridation (RPAN Cap) step 212, where the t-butoxide source is turned off with the 200 sccm He and 60 sccm $N_2$ as plasma excited gas continuing to interact with the substrate surface, where the nitrogen plasma forms a layer over the previously deposited Ti. During RPAN cap step 212, he post-deposition exposure of the TiN active species (deposited during step 210) from the nitrogen plasma of the RPAN cap step 212 increases the nitrogen content in the surface of the TiN film by replacing Ti—O bonds in the metallic rock-salt structure with Ti—N bonds.

The final cooling step 214 ceases the flow of plasma, with a continuous flow of 200 sccm He at a pressure of 300 mTorr until the temperature of the substrate drops below 100° C.

In one embodiment of the invention, the process steps described above are modified according to measurements of the coating thicknesses and effectiveness. For example, the chemical bonding within the layered structure may be measured using advanced spectroscopic techniques. These include Auger electron spectroscopy in the processing system and X-ray absorption spectroscopy using, for example, the Stanford Synchrotron Research Lightsource. Based on studies of Si-dielectric interfaces, this combination of spectroscopic techniques is sufficient to control interfacial, bulk and surface properties by variation of processing parameters.

FIG. 3 shows a cross section view of an RF window created by the process described herein. Substrate 302 may be any substrate suitable for use in an RF window, including but not limited to sapphire, single crystalline sapphire, such as 0001 orientation /0 cut sapphire, or with substrates formed from aluminum oxide ceramics comprised of sintered and compacted microcrystallites, such as those with the same bonding structure as single crystalline sapphire. The cross section view of FIG. 3 shows an atomically-engineered interface between the sapphire substrate 302, oriented in the 0001, and 1-cut direction, and deposited metallic layer such as TiN 308. This includes: the RPAO/RPAN interfacial transition region 304/306 with a physical thickness of approximately 0.6 nm, or 6 Å; the conducting TiN film 308 approximately 1.5 to 2.0 nm, or 15 to 20 Å thick, and RPAN cap 310. The interfacial region 304/306 consists of an Al oxynitride, AlON, layer formed by sequential remote plasma-assisted oxidation (RPAO) 304, and remote plasma-assisted nitridation (RPAN) 306 processes. The bonding chemistry and thickness can be measured using in-line Auger electron spectroscopy. The deposited film 308 is a thin film layer of nano-crystalline, metallic TiN formed by remote plasma-enhanced chemical vapor deposition (RPECVD), which is secured by RPAN cap 310, which substitutes Nitrogen atoms for any remaining Oxygen atoms in the titanium deposition layer.

In one embodiment of the invention, the substrate to be coated to suppress multipactor is a single crystal sapphire disk, and the resulting RF window is suitable for transmission of 100 MW of X-Band RF power.

One aspect of the present invention is the use of individual process steps which provide independent control and processing of the interfacial transition regions to form a template on the sapphire substrate which is chemically compatible with a TiN film. This is critical because TiN depositions are nanocrystalline with grain sizes limited by the film thickness. For example, for a two nanometer (nm) thick deposition, the maximum grain size is generally less than, or at most equal to, about two nano-meters. Based on studies of $HfO_2$ and $TiO_2$ thin depositions prepared using remote plasma-enhanced chemical-vapor deposition (RPECVD), this nano-grain size does not increase much beyond about four to five nanometers in significantly thicker depositions.

The process gases are mixtures of, $O_2$/He, $N_2$/He, and Ti tert (t-) butoxide/He. The Ti t-butoxide source contains Ti—O bonds. Additional research using Zr and Hf t-butoxide sources confirms that Zr—O and Hf—O bonds in these precursors are broken by excited species extracted from the plasma upstream excitation and down-stream chemical vapor deposition reactions at an oxidized Si substrate. However, Ti is less electropositive than O and Hf, and different reaction kinetics are to be expected. X-ray absorption measurements indicated Ti—O bonds were incorporated into the surface layer TiN films. Since TiO and TiN are both metals with the same rock-salt structure, this may not alter the performance of the deposited films in window applications. Stated differently, the surface of TiN film, like the surface of a $Si_3N_4$, is oxidized on exposure to air.

FIGS. 4A and 4B indicate the molecular structure of these two precursors: FIG. 4A shows tetrakis (dimethylamino) titanium (TDMAT) with Ti—N—C bonding arrangements, and Ti t-butoxide uses Ti—O—C bonding arrangements. Since C—N and C—O bonds are each stronger than Ti—O and Ti—N bonds, the proposed CVD reactions are given by: N*+Ti t-butoxide→TiN+O-t-butoxide groups [1], and N*+TDNAT→TiN+N-CH3 groups. FIG. 4B shows Ti source gases for RPECVD processes: Ti tert (t-) butoxide with Ti—O bonds, and FIG. 4A shows tetrakis (dimethylamino) titanium (TDMAT) as an alternate source gas with Ti—N bonds replacing the Ti—O bonds of the Ti t-butoxide source. In various embodiment of the invention, the substrates are (a) Si substrates with (a) SiOx, x<2, Si sub oxide interfacial transition layers formed by RPAO processing, or (b) SiON interfacial transition layers formed by the two-step sequence of RPAO, followed by RPAN.

Additional research demonstrates the following results:

(a) The RPAO process (Step 206) removed hydrocarbon contamination and formed an SiOx, x<2 Si sub-oxide layer 0.6 0.1 nm thick.

(b) The combined RPAO/RPAN process introduced ~1 monolayer of N at the Si substrate surface, as expected from the other experimental results;

(c) TiN films were deposited on either interfacial transition region;

(d) The films deposited on the RPAO/RPAN interfacial region showed a lower O content than those deposited on the RPAO only surfaces, likely from Ti—O bond formation at the SiOx interface;

(e) This difference between deposition of transition metal oxides or nitrides on either SiOx or SiON interfaces is determined from observations of the deposition of Ti, Zr and Hf oxides on Si. Ti, Zr and Hf silicates are formed at the SiOx interfaces, but not at the SiON interfaces.

Further experimental measurements examined two issues: (i) cleaning and activation of sapphire surfaces with Al—N bond formation, and (ii) deposition of TiN on these activated surfaces. The wet chemical clean (shown as step 202), prior to insertion of sapphire substrates into the plasma processing chamber, can be performed as a four step process, including rinsing in: (a) pure ethanol (1 min and 90 sec); (b) 10:1 diluted HF clean (30 sec); (c) distilled (DI) water, followed by (d) blowing drying in $N_2$. (a) The wet chemically-cleaned and blow-dried sapphire substrate displayed carbon contamination (presumably hydrocarbon) which is removed by the RPAO process 206.

(b) The combined RPAO/RPAN process results in bonded N at the sapphire surface. The AES chemical analysis indicates Al—N bond formation. The following results were obtained for deposition of TiN on plasma process sapphire substrates. (a) Films were deposited on RPAO, RPAN and RPAO/RPAN plasma processed substrates, with the RPAO process being more effective in the removal of carbon (more than likely, hydrocarbon); (b) Films deposited on sapphire substrates subjected to the RPAO/RPAN plasma processing displayed a faster deposition rate and reduced Ti—O bonding, 12 paralleling the results obtained for RPAO and RPAO/RPAN processed Si substrates.

Figure 5:
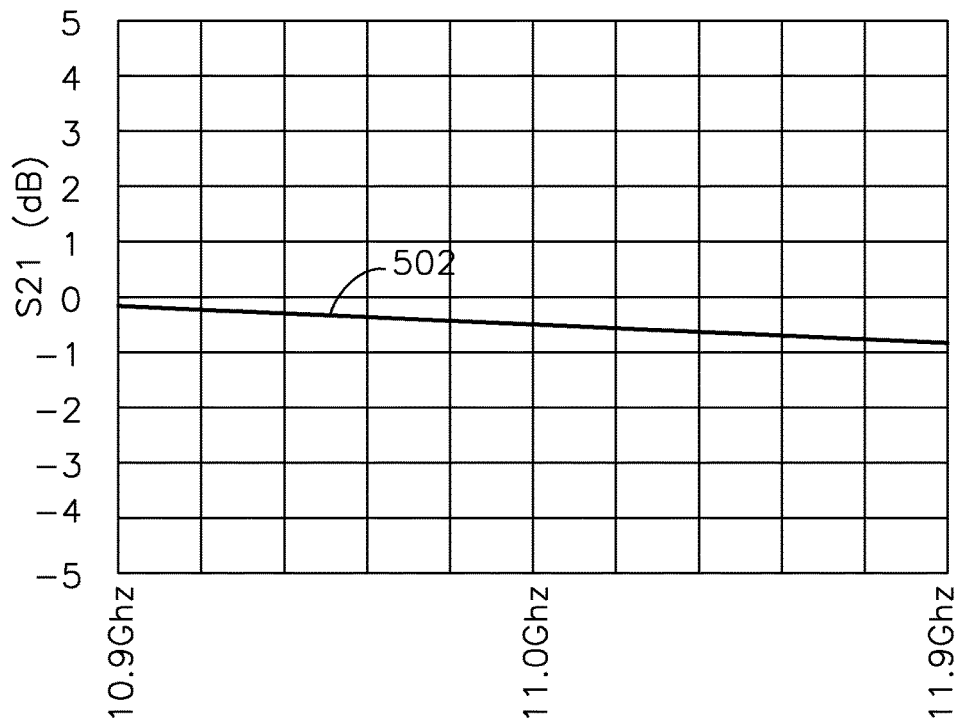
FIG. 5 is an S21 plot for an RF window.

FIG. 5 shows the RF return loss 502 for an example coated sapphire disk according to the process of the present invention. The disk was RF return loss matched at approximately 11 GHz. The indicated loss of –0.22 dB near the match point is consistent with sputter coated alumina disks. The alumina disk windows were subsequently measured as having a loss specification of 0.1 dB or less, although the increased thermal conductivity and strength of sapphire substrates makes them a superior choice for an RF window over alumina substrates.

Figure 6:
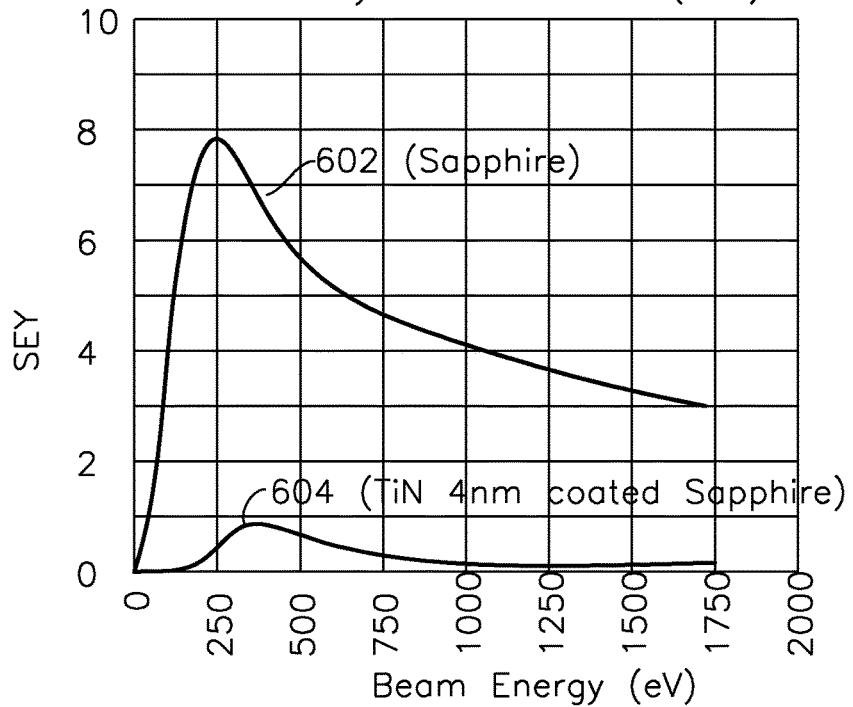
FIG. 6 is a plot of secondary emission yield for uncoated sapphire and coated sapphire windows.

FIG. 6 shows a comparison of secondary electron yield from an untreated sapphire substrate 602 and one treated 604 using the previously described TiN process of the present invention, with the TiN device of plot 604 showing greatly reduced secondary electron emission.

Figure 7:
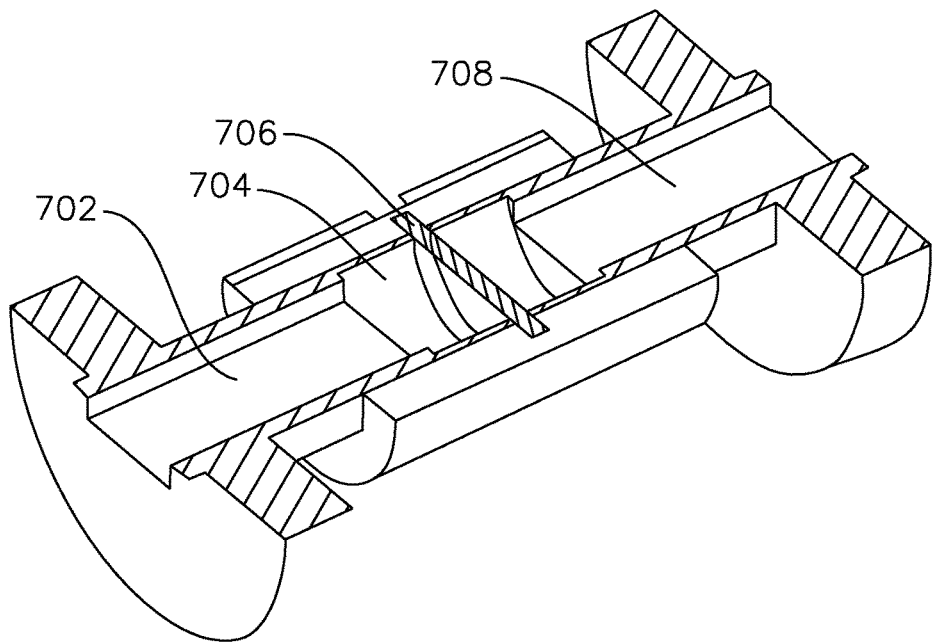
FIG. 7 is a section view of a rectangular waveguide with a pillbox RF window.
Figure 9:
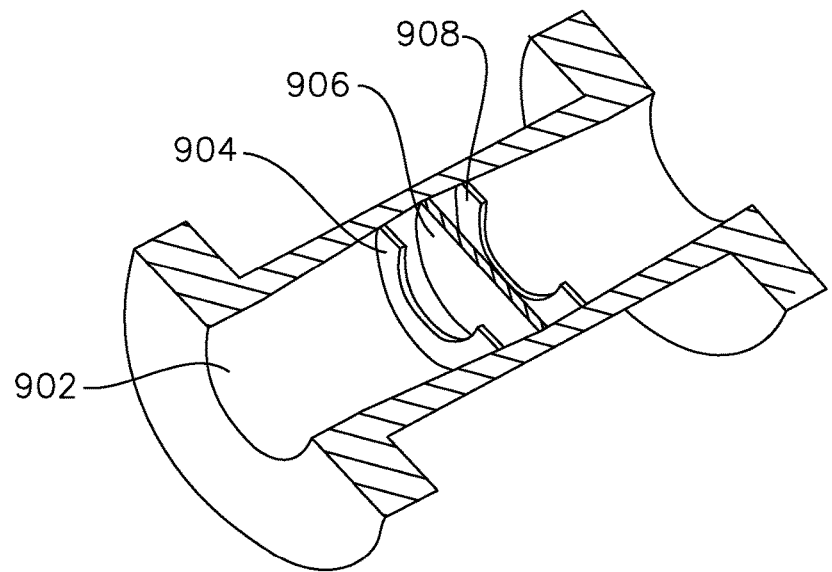
FIG. 9 is a circular waveguide with an RF window.

FIGS. 7 and 9 show two window configurations which use the present invention. The window of FIG. 9 transmits power in overmoded circular waveguide and is capable of transmission in excess of 65 MW of peak power. The window of FIG. 9 transmits a TE01 circular waveguide mode in a traveling window configuration. TE01 modes exhibit very low electric fields at the waveguide wall, providing increased immunity from arcs at joints and transitions. In a waveguide carrying TE01 mode, there are no electric fields at the waveguide-RF window interface. This particular window typically uses single crystal sapphire or high purity alumina as the window material. For this TE01 mode, multipactor is a significant issue, for which the present invention provides great benefit. Additionally, TE01 windows are used for transmitting very high levels of peak power.

Figure 8:
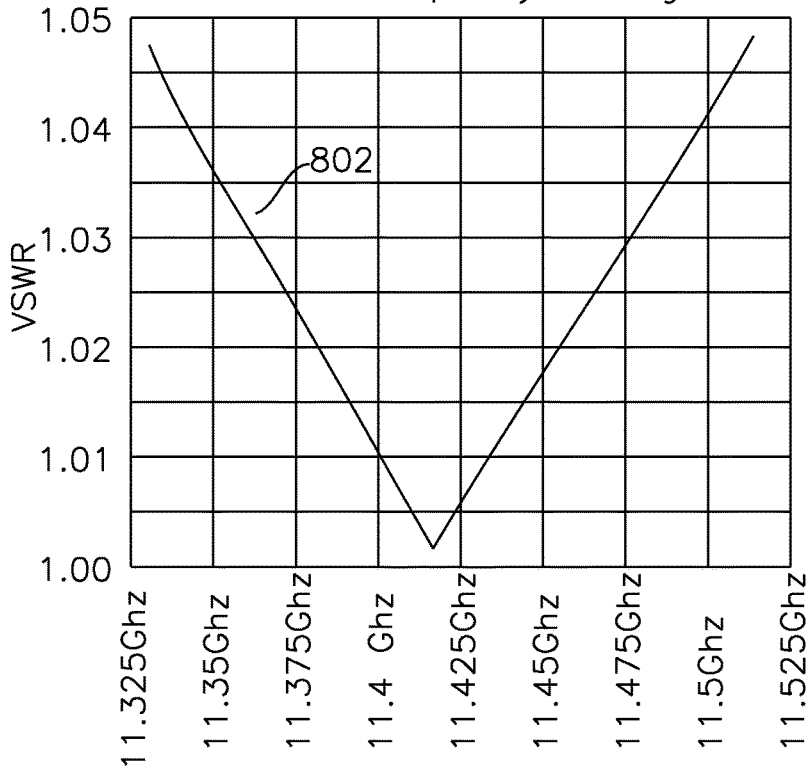
FIG. 8 is a VSWR plot of the waveguide of FIG. 7.
Figure 10:
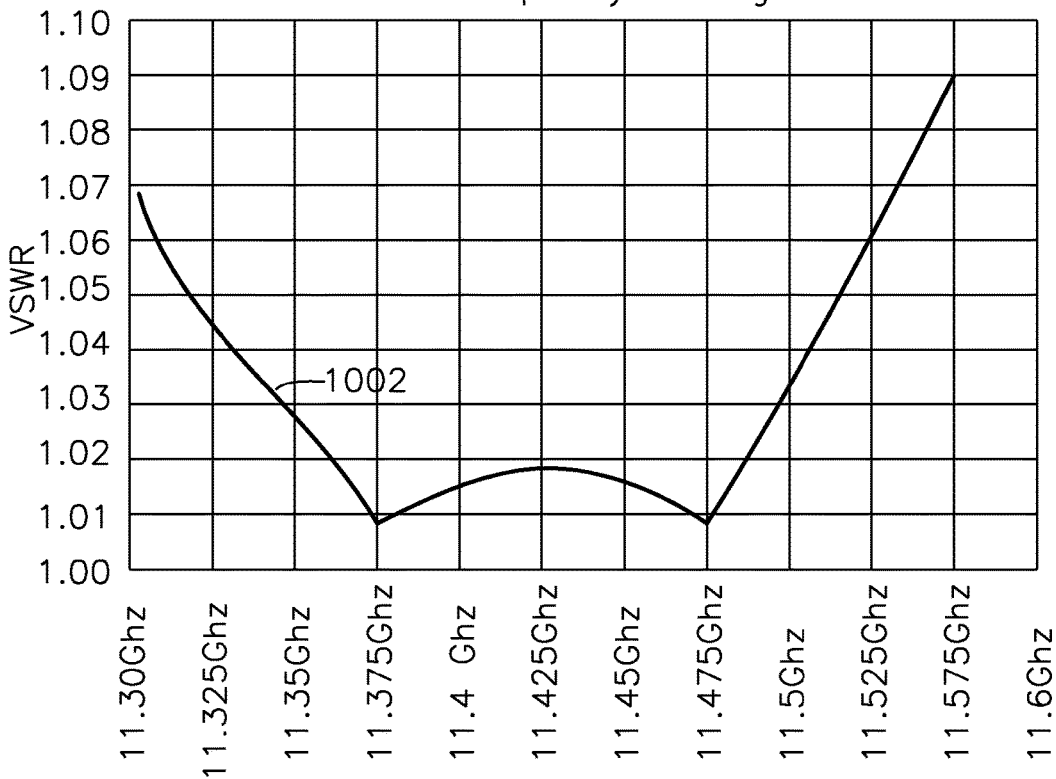
FIG. 10 is the VSWR plot of the circular waveguide of FIG. 9.

FIG. 7 shows an RF window for use in rectangular waveguide 702, 708 with a pillbox section 704, which transmits power in the TE10 fundamental rectangular mode in the waveguide sections 702 and 708 and the TE11 mode in the pillbox section 704. This window design is used for most applications, particularly where it is desirable to avoid mode converters in the transmission system. The sapphire ceramic 706 is face brazed into the pillbox section 704. The calculated VSWR is shown in FIG. 8. This window exhibits less than 1.05:1 VSWR over a bandwidth exceeding 200 MHz. The higher power, TE01 window of FIG. 9 is designed for power levels exceeding 35 MW. Simulations indicate that the window should be able to transmit power levels exceeding 100 MW. The traveling wave design minimizes electric fields in the dielectric. As with the pillbox window, the sapphire ceramic 906 is face brazed into the circular waveguide of the window. Note that the design includes an internal waveguide taper and matching irises 904 and 908 adjacent to the sapphire ceramic 906. The calculated VSWR response is also shown in FIG. 10. This window exhibits a VSWR of less than 1.05:1 over a bandwidth exceeding 200 MHz.

We claim:

1. A process for fabrication of an RF window from a substrate in a chamber, the process comprising:
    a cleaning step including a rinse step, an acid etching step, a soak step and a drying step applied to at least the surface of said substrate;
    a substrate heating step wherein said substrate in said chamber is subjected to a flow of inert gas while said substrate is heated to a deposition temperature, said chamber held in a state of partial vacuum;
    a remote plasma assisted oxidation (RPAO) deposition step wherein said substrate receives a flow of plasma gas formed by mixing an inert gas with oxygen, the plasma gas directed to a surface of said substrate while said chamber is held in a state of partial vacuum;
    a remote plasma assisted nitridation (RPAN) deposition step wherein said substrate receives a flow of plasma gas formed by mixing an inert gas with nitrogen, the plasma gas directed to a surface of said substrate while said chamber is held in a state of partial vacuum;
    a TiN deposition step wherein said substrate receives a flow of plasma gas formed by mixing an inert gas with nitrogen, the plasma gas directed to the substrate surface along with reactable titanium in gaseous form, said reactable titanium in gaseous form is Ti tert-butoxide, which is bubbled through glycerin, then heated to substantially 300° C., during which step said depositions chamber is held in a state of partial vacuum;
    an RPAN cap step wherein said substrate receives a flow of plasma gas formed by mixing an inert gas with nitrogen, the plasma gas directed to the substrate surface, during which step said chamber is held in a state of partial vacuum;
    a cooling step wherein said substrate receives a flow of inert gas for a duration of time until said substrate reaches a temperature below 100° C., during which time said chamber is held in a state of partial vacuum;
    a removal step wherein said substrate is removed from said chamber.

2. The process of claim 1 wherein said inert gas is helium.

3. The process of claim 1 wherein said RPAO deposition step plasma is formed by a flow rate of substantially 200 sccm of helium accompanied by a flow rate of 20 sccm of oxygen.

4. The process of claim 1 wherein said RPAO deposition step plasma is formed by a mixture of helium and oxygen.

5. The process of claim 1 wherein said RPAO deposition step plasma is a mixture of substantially 20% oxygen and 80% helium.

6. The process of claim 1 wherein at least one of said RPAO deposition step partial vacuum, said RPAN deposition step partial vacuum, said TiN deposition step partial vacuum, or said RPAN cap deposition step partial vacuum is 300 mTorr or less.

7. The process of claim 1 wherein said RPAN deposition step plasma, said TiN deposition step plasma, and said RPAN step plasma is formed by a flow rate of 200 sccm of helium accompanied by a flow rate of 60 sccm of nitrogen.

8. The process of claim 1 wherein said TiN deposition step reactable titanium in gaseous form is delivered into said chamber using a ring having a plurality of apertures.

9. The process of claim 1 wherein said plasma is formed using an RF source coupled to the gasses forming said plasma, said plasma gasses thereafter delivered to said chamber.

10. The process of claim 1 where said substrate is at least one of a ceramic, a sintered ceramic, a non-sintered ceramic, sapphire, quartz, or diamond.

11. A process for fabrication of an RF window from a substrate in a chamber, the process comprising:
deposition by remote plasma assisted oxidation (RPAO) wherein a substrate receives a flow of plasma gas formed by mixing an inert gas with oxygen, the plasma gas directed to a surface of said substrate while said chamber is held in a state of partial vacuum;
deposition by remote plasma assisted nitridation (RPAN) wherein said substrate receives a flow of plasma gas formed by mixing an inert gas with nitrogen, the plasma gas directed to a surface of said substrate while said chamber is held in a state of partial vacuum;
deposition of TiN wherein said substrate receives a flow of plasma gas formed by mixing an inert gas with nitrogen, the plasma gas directed to the substrate surface along with reactable titanium in gaseous form, said reactable titanium in gaseous form is Ti tert-butoxide, which is bubbled through glycerin, then heated to substantially 300° C., during which step said deposition chamber is held in a state of partial vacuum;
deposition by remote plasma assisted nitridation following said deposition of TiN wherein said substrate receives a flow of plasma gas formed by mixing an inert gas with nitrogen, the plasma gas directed to the substrate surface, during which step said chamber is held in a state of partial vacuum.

12. The process of claim 11 wherein said inert gas is helium.

13. The process of claim 11 wherein said deposition by RPAO uses a flow rate of substantially 200 sccm of helium accompanied by a flow rate of 20 sccm of oxygen.

14. The process of claim 11 wherein said deposition of RPAO uses a mixture of helium and oxygen.

15. The process of claim 11 wherein said deposition of RPAO uses a mixture of substantially 20% oxygen and 80% helium.

16. The process of claim 11 wherein at least one of said deposition by RPAO, said deposition by RPAN, said deposition of TiN, or said deposition of RPAN uses a partial vacuum of 300 mTorr or less.

17. The process of claim 11 wherein at least one of said deposition by RPAN deposition, said deposition of TiN, or said subsequent deposition by RPAN uses a plasma formed by a flow rate of substantially 200 sccm of helium accompanied by a flow rate of substantially 60 sccm of nitrogen.

18. The process of claim 11 wherein said TiN deposition step reactable titanium in gaseous form is delivered into said chamber using a ring having a plurality of apertures.

19. The process of claim 11 wherein said plasma is formed using an RF source coupled to the gasses forming said plasma, said plasma gasses thereafter delivered to said chamber.

20. The process of claim 11 where said substrate is at least one of a ceramic, a sintered ceramic, a non-sintered ceramic, sapphire, quartz, or diamond.

* * * * *